US008222972B2

(12) United States Patent
Inoue et al.

(10) Patent No.: US 8,222,972 B2
(45) Date of Patent: Jul. 17, 2012

(54) ACOUSTIC WAVE ELEMENT, DUPLEXER, COMMUNICATION MODULE, AND COMMUNICATION APPARATUS

(75) Inventors: Kazunori Inoue, Kawasaki (JP); Takashi Matsuda, Kawasaki (JP); Michio Miura, Kawaski (JP); Suguru Warashina, Kawasaki (JP)

(73) Assignee: Taiyo Yuden Co., Ltd., Tokyo (JP)

(*) Notice: Subject to any disclaimer, the term of this patent is extended or adjusted under 35 U.S.C. 154(b) by 53 days.

(21) Appl. No.: 12/712,144

(22) Filed: Feb. 24, 2010

(65) Prior Publication Data

US 2010/0148890 A1 Jun. 17, 2010

Related U.S. Application Data

(63) Continuation of application No. PCT/JP2007/071128, filed on Oct. 30, 2007.

(51) Int. Cl.
*H03H 9/46* (2006.01)

(52) U.S. Cl. ........................................ 333/133; 333/193

(58) Field of Classification Search .................. 333/133, 333/193–196; 310/313 R–313 D; 29/25.35, 29/592.1, 594

See application file for complete search history.

(56) References Cited

U.S. PATENT DOCUMENTS

| | | | | |
|---|---|---|---|---|
| 5,738,931 | A * | 4/1998 | Sato et al. | 428/209 |
| 6,791,237 | B2 | 9/2004 | Yamanouchi | |
| 6,937,114 | B2 | 8/2005 | Furukawa et al. | |
| 7,215,223 | B2 * | 5/2007 | Hattanda et al. | 333/193 |
| 7,218,038 | B2 | 5/2007 | Matsuda et al. | |
| 7,230,365 | B2 | 6/2007 | Nishiyama et al. | |
| 7,322,093 | B2 * | 1/2008 | Kadota et al. | 29/594 |
| 7,411,334 | B2 | 8/2008 | Nishiyama et al. | |
| 7,418,772 | B2 | 9/2008 | Nishiyama et al. | |
| 7,466,061 | B2 * | 12/2008 | Miura et al. | 310/313 R |

(Continued)

FOREIGN PATENT DOCUMENTS

EP 1 239 588 A2 9/2002

(Continued)

OTHER PUBLICATIONS

Masatsune Yamaguchi et al., "Highly Piezoelectric Boundary Waves in $Si/SiO_2/LiNbO_3$ Structure", Proceeding of 1998 IEEE International Frequency Control Symposium, IEEE, 1998, pp. 484-488.

*Primary Examiner* — Dean O Takaoka
*Assistant Examiner* — Alan Wong
(74) *Attorney, Agent, or Firm* — Chen Yoshimura LLP

(57) ABSTRACT

An acoustic wave element includes: resonators 2 each including an electrode to excite acoustic waves; a power supply wiring portion 3 that is disposed so as to connect the resonators 2 electrically; a piezoelectric substrate 4 on which the resonators 2 and the power supply wiring portion 3 are formed; a second medium 5 that is formed on the piezoelectric substrate 4 so as to cover the resonators 2; and a third medium 6 that is formed on the piezoelectric substrate 4 so as to cover at least the second medium 5 and the power supply wiring portion 3. A side surface 34 of the power supply wiring portion 3 that is in contact with a surface of the piezoelectric substrate 4 forms an obtuse first angle θ with respect to the surface 4a of the piezoelectric substrate 4.

16 Claims, 17 Drawing Sheets

U.S. PATENT DOCUMENTS

| | | | | |
|---|---|---|---|---|
| 7,741,931 | B2 * | 6/2010 | Matsuda et al. | 333/133 |
| 2002/0140316 | A1 | 10/2002 | Yamanouchi | |
| 2004/0070313 | A1 | 4/2004 | Furukawa et al. | |
| 2004/0164644 | A1 | 8/2004 | Nishiyama et al. | |
| 2005/0151602 | A1 | 7/2005 | Hattanda et al. | |
| 2006/0220494 | A1 | 10/2006 | Miura et al. | |
| 2007/0132339 | A1 | 6/2007 | Nishiyama et al. | |
| 2007/0214622 | A1 | 9/2007 | Nishiyama et al. | |

FOREIGN PATENT DOCUMENTS

| | | | |
|---|---|---|---|
| EP | 1 391 988 | A2 | 2/2004 |
| EP | 1 460 759 | A1 | 9/2004 |
| EP | 1 555 751 | A1 | 7/2005 |
| JP | 11-41054 | A | 2/1999 |
| JP | 2001-168671 | A | 6/2001 |
| JP | 2002-026686 | A | 1/2002 |
| JP | 2003-209458 | A | 7/2003 |
| JP | 2004-112748 | A | 4/2004 |
| JP | 2004-356671 | A | 12/2004 |
| JP | 2005-203889 | A | 7/2005 |
| JP | 2006-279609 | A | 10/2006 |
| WO | WO 98/52279 | A1 | 11/1998 |
| WO | 03/058813 | A1 | 7/2003 |

* cited by examiner

ACOUSTIC WAVE ELEMENT, DUPLEXER, COMMUNICATION MODULE, AND COMMUNICATION APPARATUS

CROSS-REFERENCE TO RELATED APPLICATION

This application is based upon and claims the benefit of priority of the prior PCT/JP2007/071128 filed on Oct. 30, 2007, the entire contents of which are incorporated herein by reference.

FIELD

The present application relates to an acoustic wave element, a duplexer, a communication module, and a communication apparatus.

BACKGROUND

Conventionally, a SAW (Surface Acoustic Wave) device has been well known as one of the devices that use acoustic waves. The SAW device is used in a variety of circuits that process radio signals in a frequency band of 45 MHz to 2 GHz, which is commonly used in mobile phone terminals, for example. Such circuits are used in a transmission band-pass filter, a reception band-pass filter, a local filter, an antenna duplexer, an IF filter, an FM modulator, and the like.

The mobile phone terminals as described above are often used in various temperature environments, outdoors and indoors. Thus, the SAW device needs to have a feature capable of operating stably in various temperature environments. JP 2003-209458 A discloses an acoustic wave element in which an oxide silicon film having a temperature characteristics code different from that of a piezoelectric substrate is formed on the piezoelectric substrate. However, the configuration disclosed in Patent Document 1 has a problem in that the acoustic wave element becomes large.

JP 2004-112748 A, International Publication WO 98/052279, and a Non-Patent Document (Masatsune Yamaguchi, Takashi Yamashita, Ken-ya Hashimoto, Tatsuya Omori, "Highly Piezoelectric Boundary Waves in Si/SiO2/LiNbO3 Structure", Proceeding of 1998 IEEE International Frequency Control Symposium, (US), IEEE, 1998, pp. 484-488) disclose an acoustic wave element using Love waves, and an acoustic boundary wave element using boundary waves that propagate between boundaries of different media. Any of these configurations can achieve an improvement in temperature characteristics and the downsizing of the acoustic wave element.

The acoustic wave elements and the acoustic boundary wave elements disclosed in JP 2003-209458 A, JP 2004-112748 A, International Publication WO 98/052279, and the Non-Patent Document are less reliable.

SUMMARY

An acoustic wave element according to the present application includes: resonators each including an electrode to excite acoustic waves; a power supply wiring portion that is disposed so as to be connected to the resonators electrically; a first medium on which the resonators and the power supply wiring portion are formed; a second medium that is formed on the first medium so as to cover the resonators; and a third medium that is formed on the first medium so as to cover at least the second medium and the power supply wiring portion. A side surface of the power supply wiring portion that is in contact with a surface of the first medium forms an obtuse first angle with respect to the surface of the first medium.

A method for manufacturing an acoustic wave element according to the present application includes: a first step of applying a resist onto a first medium; a second step of patterning the resist so that a power supply wiring portion can be formed on the first medium; a third step of forming a film of a material for forming the power supply wiring portion on the first medium; a fourth step of removing the resist; and a fifth step of forming a third medium so as to cover the power supply wiring portion. In the second step, the resist is patterned so that a side surface of the patterned resist that is in contact with the first medium forms an acute angle with respect to a surface of the first medium.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Figure 1A:
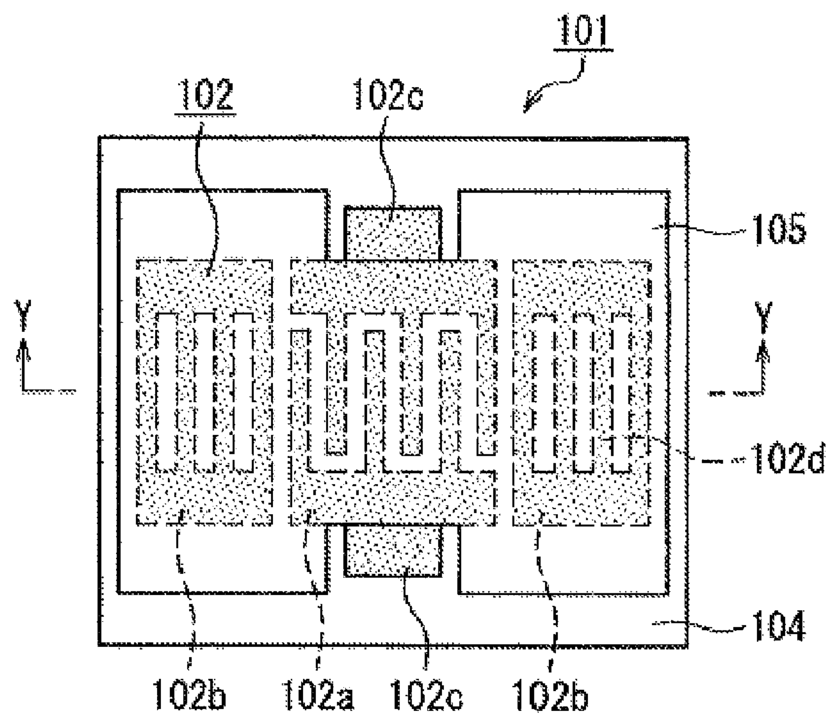
FIG. 1A is a plan view illustrating a configuration of a conventional acoustic wave element.

An acoustic wave element includes: resonators each including an electrode to excite acoustic waves; a power supply wiring portion that is disposed so as to be connected to the resonators electrically; a first medium on which the resonators and the power supply wiring portion are formed; a second medium that is formed on the first medium so as to cover the resonators; and a third medium that is formed on the first medium so as to cover at least the second medium and the power supply wiring portion. A side surface of the power supply wiring portion that is in contact with a surface of the first medium forms an obtuse first angle with respect to the surface of the first medium. With this configuration, it is possible to suppress the formation of gaps during the formation of the third medium, so that the power supply wiring portion can be prevented from being corroded by water.

A method for manufacturing an acoustic wave element includes: a first step of applying a resist onto a first medium; a second step of patterning the resist so that a power supply wiring portion can be formed on the first medium; a third step of forming a film of a material for forming the power supply wiring portion on the first medium; a fourth step of removing the resist; and a fifth step of forming a third medium so as to cover the power supply wiring portion. In the second step, the resist is patterned so that a side surface of the patterned resist that is in contact with the first medium forms an acute angle with respect to a surface of the first medium. With this manufacturing method, a side surface of the power supply wiring portion can be tapered forward.

Based on the above-described configuration and method, the acoustic wave element and the method for manufacturing the same can have the following various aspects.

Namely, in the acoustic wave element, a second angle formed between a side surface of each of the resonators that is in contact with the surface of the first medium and the surface of the first medium can be smaller than the first angle.

In the acoustic wave element, the power supply wiring portion can include a third layer formed on the surface of the first medium, a second layer formed on the third layer, and a first layer formed on the second layer, and the first layer and the third layer can be made of a material that is more corrosion-resistant than a material of the second layer. With this configuration, even if water enters the power supply wiring portion, corrosion of the power supply wiring portion can be prevented.

In the acoustic wave element, the second layer can be made of a material containing copper as a main component. With this configuration, it is possible to achieve a power supply wiring portion with low electrical resistance.

In the acoustic wave element, the first layer or the third layer can be formed so as to cover the second layer on the side surface of the power supply wiring portion. With this configuration, even if the second layer is made of a material that is relatively susceptible to corrosion, corrosion of the second layer can be prevented.

In the acoustic wave element, the first layer or the third layer can be made of one or two or more of metals of titanium, chromium, nickel, molybdenum, tantalum, tungsten, platinum, and gold. With this configuration, even if water enters the power supply wiring portion, corrosion of the power supply wiring portion can be prevented. In particular, the use of titanium for the first layer or the third layer can lead to high corrosion resistance and improved adhesion to the adjacent layer. Further, the use of nickel for the first layer or the third layer can contribute to reduced cost.

In the acoustic wave element, the third medium can cover a part or all of the power supply wiring portion. With this configuration, heat generated by the power supply wiring portion can be dissipated efficiently.

In the acoustic wave element, the third medium can be made of alumina. With this configuration, heat generated by the power supply wiring portion can be dissipated efficiently. In particular, alumina, which has an excellent thermal conductivity, can achieve a high heat dissipation effect.

The acoustic wave element further can include a terminal electrode that is formed so as to be connected electrically to an electrode included in the power supply wiring portion and so as not to be covered with the third medium. The terminal electrode can be made of titanium and gold. With this configuration, a gold bump can be achieved, and the terminal electrode and the electrode included in the power supply wiring portion can be connected reliably to each other due to good adhesion of titanium.

In the acoustic wave element, the power supply wiring portion can contain an electrode that is the same as the electrode forming the resonators. With this configuration, the electrode forming the resonators and the electrode forming the power supply wiring portion can be formed at the same time, resulting in a reduction in the number of manufacturing steps.

In the method for manufacturing an acoustic wave element, in the fifth step, the third medium can be formed by a sputtering method, a vacuum deposition method, or a chemical vapor deposition method.

In the method for manufacturing an acoustic wave element, the power supply wiring portion can be patterned by a lift-off method. With this method, a forward tapered portion of the power supply wiring portion can be formed easily.

Embodiment

1. Configuration of Acoustic Wave Element

Figure 1B:
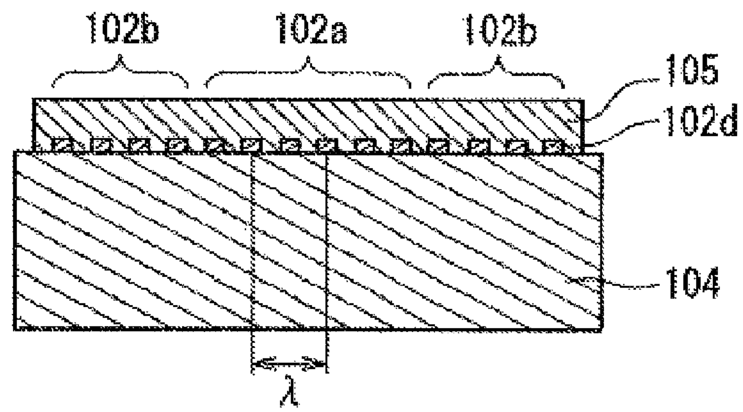
FIG. 1B is a cross-sectional view taken along a line Y-Y in FIG. 1A.

FIG. 1A is a plan view of the acoustic wave element disclosed in JP 2003-209458 A. FIG. 1B illustrates a cross section taken along a line Y-Y in FIG. 1A. As illustrated in FIGS. 1A and 1B, the acoustic wave element has a resonator 102 that is formed of an electrode on a piezoelectric substrate 104 (first medium). The resonator 102 includes an interdigitated electrode 102*a*, reflectors 102*b*, and a terminal portion 102*c*. A dielectric layer 105 (second medium) is formed on the piezoelectric substrate 104 so as to cover the interdigitated electrode 102*a* and the reflectors 102*b* with the terminal portion 102*c* exposed. The thickness of the dielectric layer 105 is larger than that of the electrode forming the resonator 102, and is about $0.3\times\lambda$ where $\lambda$ is a wavelength of a surface acoustic wave.

Figure 2A:
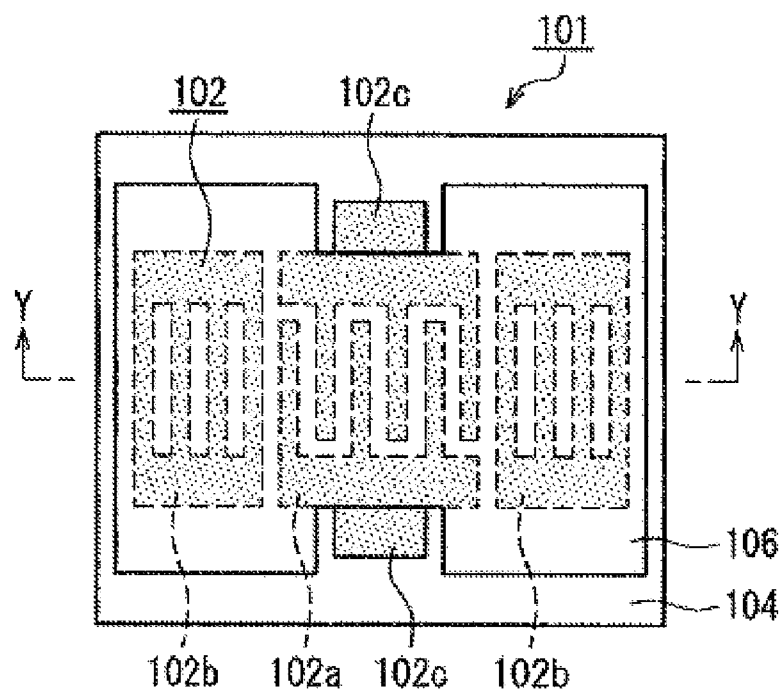
FIG. 2A is a plan view illustrating a configuration of a conventional acoustic boundary wave element.
Figure 2B:
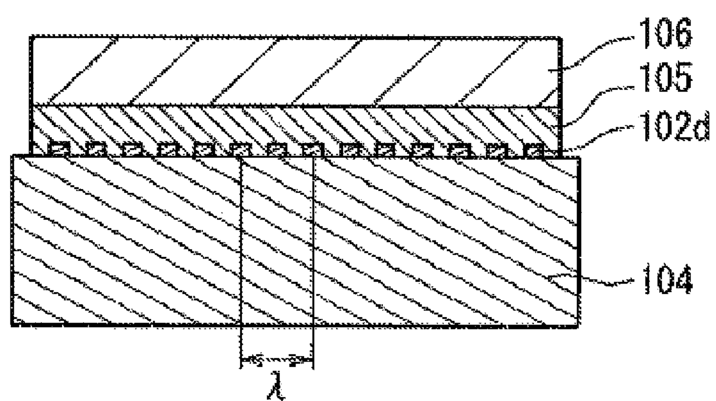
FIG. 2B is a cross-sectional view taken along a line Y-Y in FIG. 2A.

FIG. 2A is a plan view of the acoustic boundary wave element disclosed in International Publication WO 98/052279. FIG. 2B illustrates a cross section taken along a line Y-Y in FIG. 2A. In FIGS. 2A and 2B, the same components as those in FIGS. 1A and 1B are denoted with the same reference numerals, and descriptions thereof are omitted. The configuration illustrated in FIGS. 2A and 2B further includes a third medium 106 on the dielectric layer 105 illustrated in FIGS. 1A and 1B.

The present inventors conducted reliability evaluations of the acoustic wave element illustrated in FIGS. 1A and 1B or the acoustic boundary wave element illustrated in FIGS. 2A and 2B. The following is a description of the reliability evaluations of the acoustic boundary wave element illustrated in FIGS. 2A and 2B by way of example.

Figure 3A:
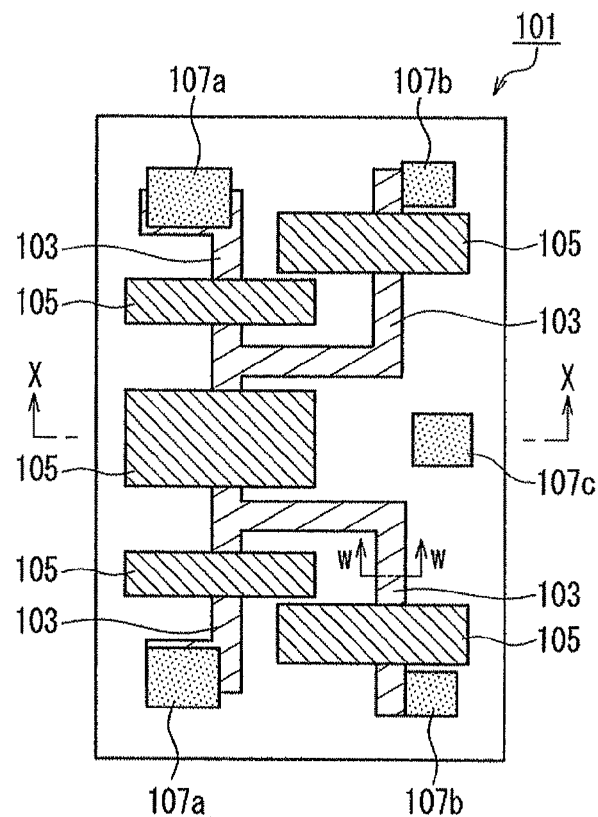
FIG. 3A is a plan view illustrating a configuration of a conventional acoustic wave element used in an evaluation test.
Figure 3B:
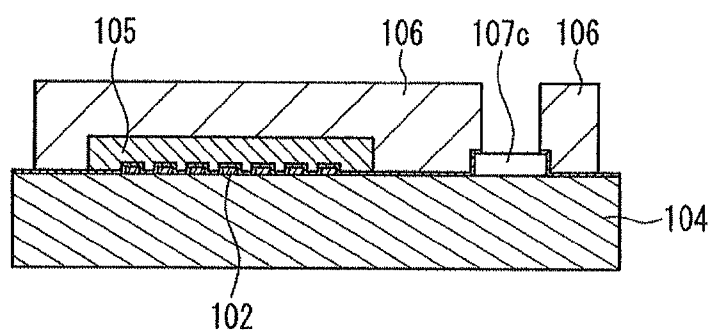
FIG. 3B is a cross-sectional view taken along a line W-W in FIG. 3A.

FIG. 3A illustrates a structure of a prototype of the acoustic boundary wave element (filter). FIG. 3B illustrates a cross section taken along a line X-X in FIG. 3A. The acoustic boundary wave element illustrated in the figures includes the resonators 102 and a power supply wiring portion 103, each formed of an electrode, the dielectric layer 105 (second medium), and the third medium 106 on the piezoelectric substrate ($LiNbO_3$ or the like) 104. Next, a method for manufacturing the acoustic boundary wave element illustrated in FIGS. 3A and 3B will be described.

Figure 4A:
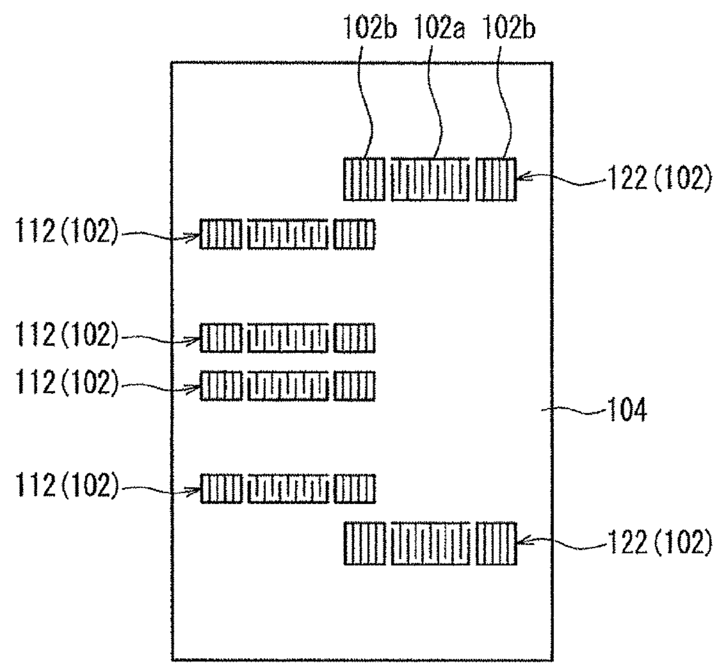
FIG. 4A is a plan view illustrating a state where resonators are formed on a piezoelectric substrate.

Initially, as illustrated in FIG. 4A, the resonators 102 are formed on the piezoelectric substrate 104. The resonators 102 include serial resonators 112 and parallel resonators 122 in accordance with the connection form. The interdigitated electrode 102*a* and the reflectors 102*b* are made of Cu in consideration of bandpass characteristics.

Figure 4B:
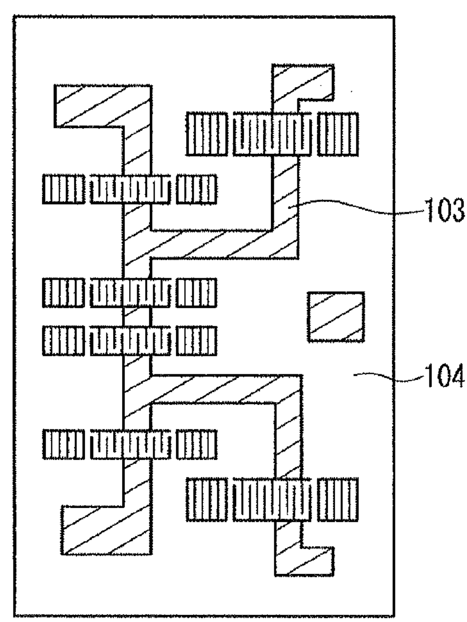
FIG. 4B is a plan view illustrating a state where electrodes are formed on the piezoelectric substrate.

Then, as illustrated in FIG. 4B, the power supply wiring portion 103 formed of an electrode that connects the respective resonators 102 electrically is formed. The power supply wiring portion 103 is made of Cu so as to reduce electrical resistance. The thickness of the electrode of the power supply wiring portion 103 is larger than that of the electrode forming the resonators 102, so that electrical resistance is reduced.

Figure 4C:
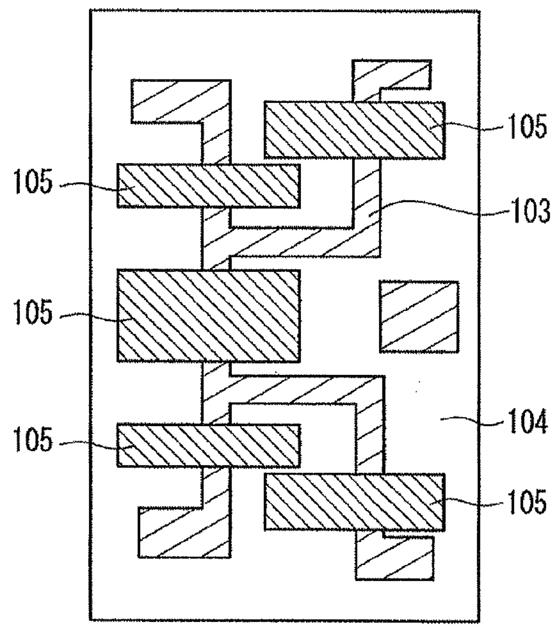
FIG. 4C is a plan view illustrating a state where a second medium is formed on the resonators.

Thereafter, as illustrated in FIG. 4C, the resonators 102 are covered with the second medium 105. The second medium 105 is made of oxide silicon ($SiO_2$). The second medium 105, which covers only the resonators 102, does not cover the power supply wiring portion 102 in consideration of heat dissipation. The $SiO_2$ film is formed by a CVD (Chemical Vapor Deposition) method. After the formation of the second medium 105, excess $SiO_2$ is removed by dry etching.

Figure 4D:
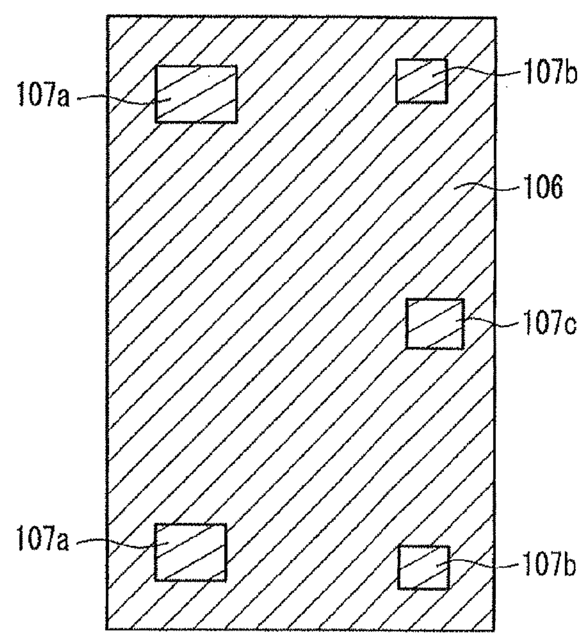
FIG. 4D is a plan view illustrating a state where a third medium is formed on the piezoelectric substrate.

After that, as illustrated in FIG. 4D, the resonators 102 and the power supply wiring portion 103 are covered with the third medium 106. In the present configuration, the third medium 106 is made of alumina ($Al_2O_3$). The alumina film is formed by a common sputtering method. During the formation of the third medium 106, the power supply wiring portion 103 is patterned by a lift-off method so as to be exposed at regions where a terminal electrode 107 is to be formed. Also, the power supply wiring portion 103 is exposed similarly at a region where a dummy electrode 107*c* is to be formed.

Figure 4E:
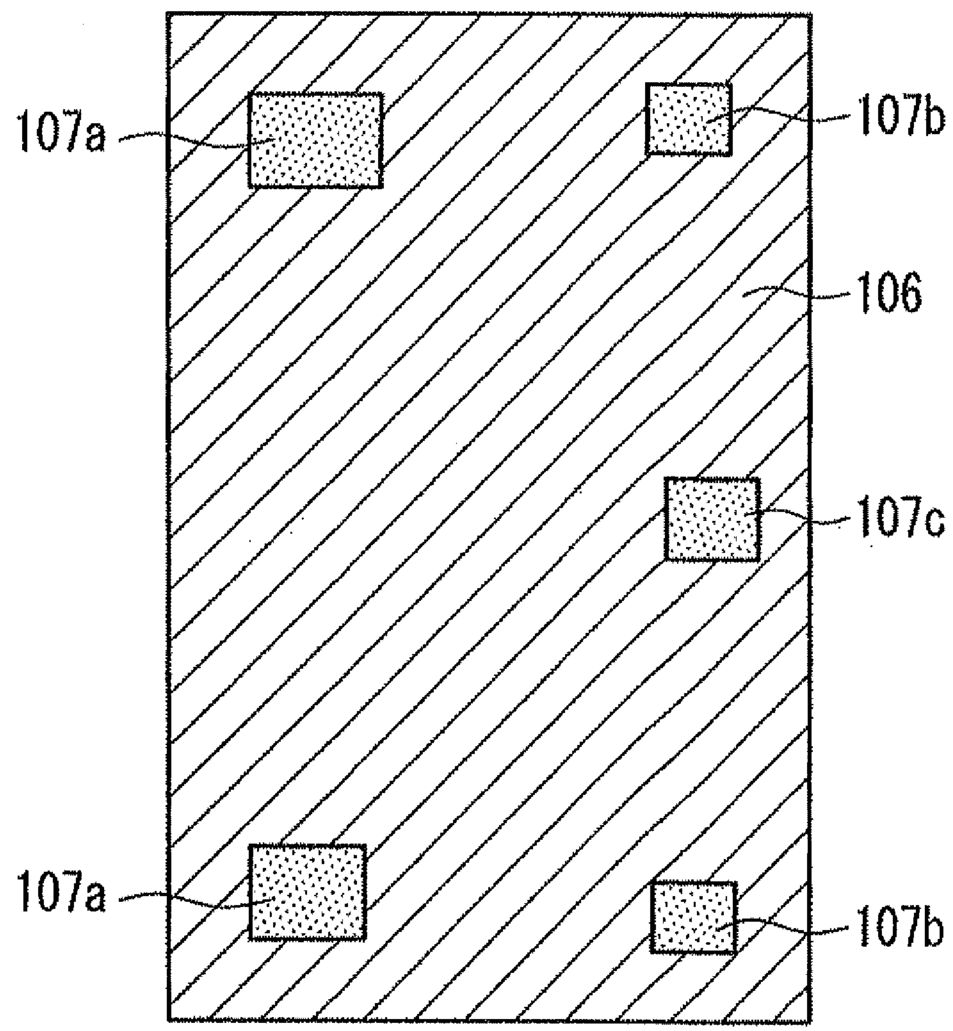
FIG. 4E is a plan view illustrating a state where a terminal electrode is formed in exposed regions of the electrode on the third medium.

Then, as illustrated in FIG. 4E, the terminal electrode 107 is formed in the exposed regions of the power supply wiring portion 103 on the third medium 106. The terminal electrode 107 includes input/output electrodes 107*a* capable of inputting and outputting an electric signal, ground electrodes 107*b*, and the dummy electrode 107*c*. The terminal electrode 107 is made of Au so as to form an Au bump.

As described above, according to the structure of the conventional acoustic boundary wave element, only the terminal electrode 107 is exposed with the portions other than the terminal electrode 107 covered with the third medium 106.

The acoustic boundary wave element obtained by the above-described manufacturing method was subjected to a reliability test. The reliability test was a common pressure cooker test. The acoustic boundary wave element was exposed to an atmosphere at a temperature of 120° C. and a humidity of 95% and then removed from this atmosphere in 96 hours so as to be checked for corrosion.

Figure 5:
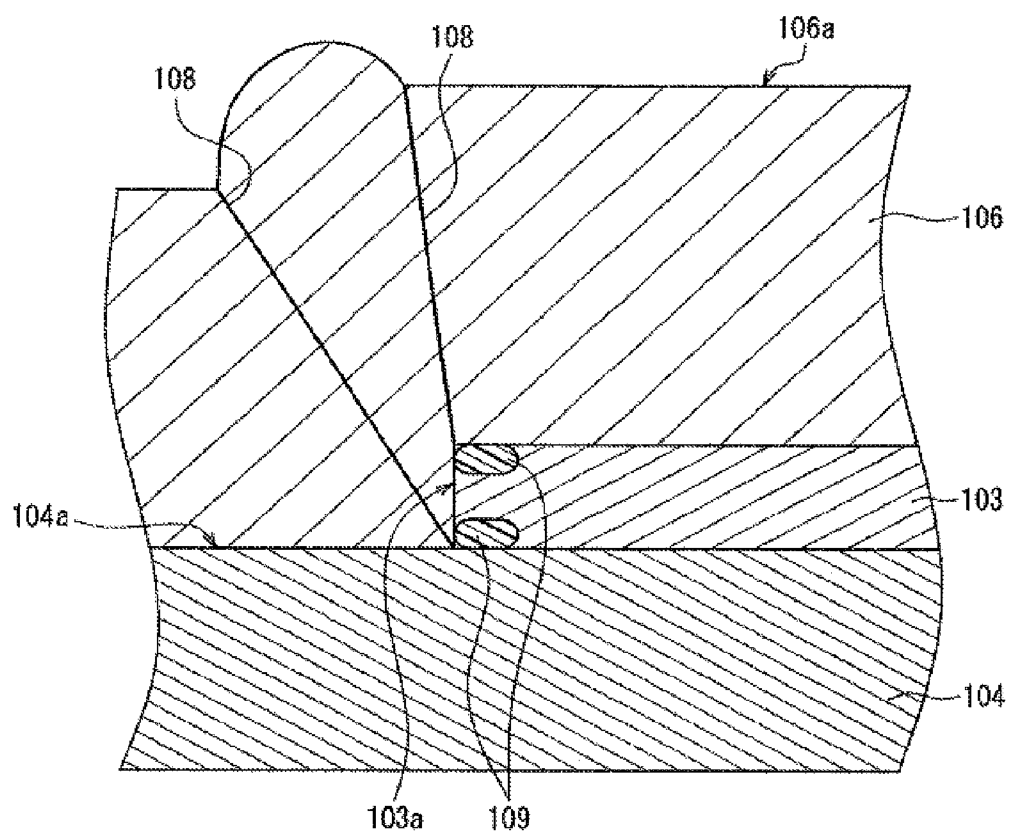
FIG. 5 is a cross-sectional view of the vicinity of a power supply wiring portion of the conventional acoustic wave element.

As a result, it was found that the power supply wiring portion 103 was corroded. FIG. 5 is a cross-sectional view taken along a line W-W in FIG. 3A, illustrating a configuration in the vicinity of the power supply wiring portion of the acoustic wave element after being subjected to the reliability test. The state of corroded portions 109 formed in the power supply wiring portion 103 and the vicinity thereof was checked. As a result, it was found that slight gaps 108 were formed so as to pass through the film of the third medium 106 from a surface 106*a* of the third medium 106 to the power supply wiring portion 103, and these gaps 108 allowed water to enter externally, resulting in corrosion of the power supply wiring portion 103. When a surface 104*a* of the piezoelectric substrate 104 and a surface of an end portion 103*a* form a right or acute angle, the gaps 108 are formed during the film formation of the third medium 106 due to a step formed between the power supply wiring portion 103 and the piezoelectric substrate 104.

The resonators 102 were not corroded. This was because since the thickness of the electrode forming the resonators 102 was smaller than that of the electrode forming the power supply wiring portion 103, there was substantially no step between the resonators 102 and the surface 104*a* of the piezoelectric substrate 104, which prevented the formation of any gaps extending from the power supply wiring portion 103 to the outside. Also, it was found to be the reason for causing no corrosion that the resonators 102 were covered with the two layers of the second medium 105 ($SiO_2$) and the third medium 106 (alumina).

Further, the acoustic wave element illustrated in FIGS. 1A and 1B was subjected to the reliability test in the same manner as described above. As a result, it was found that the power supply wiring portion was corroded similarly.

With the configurations illustrated in FIGS. 1A, 1B, 2A, and 2B, the step between the power supply wiring portion 103 and the piezoelectric substrate 104 causes the gaps 108 to be formed in the third medium 106, resulting in corrosion of the power supply wiring portion 103.

In order to make the step between the power supply wiring portion 103 and the piezoelectric substrate 104 smaller, the electrode forming the power supply wiring portion 103 may be made thinner. However, when the power supply wiring portion 103 is made thinner, the power supply wiring portion 103 has a smaller cross-sectional area, which leads to an increase in electrical resistance.

As described above, the conventional acoustic wave element and acoustic boundary wave element are less reliable.

It is an object of the present embodiment to achieve an acoustic wave element that is not corroded and has excellent reliability with low electrical resistance in a power supply wiring portion, a duplexer, a communication module, and a communication apparatus.

Figure 6A:
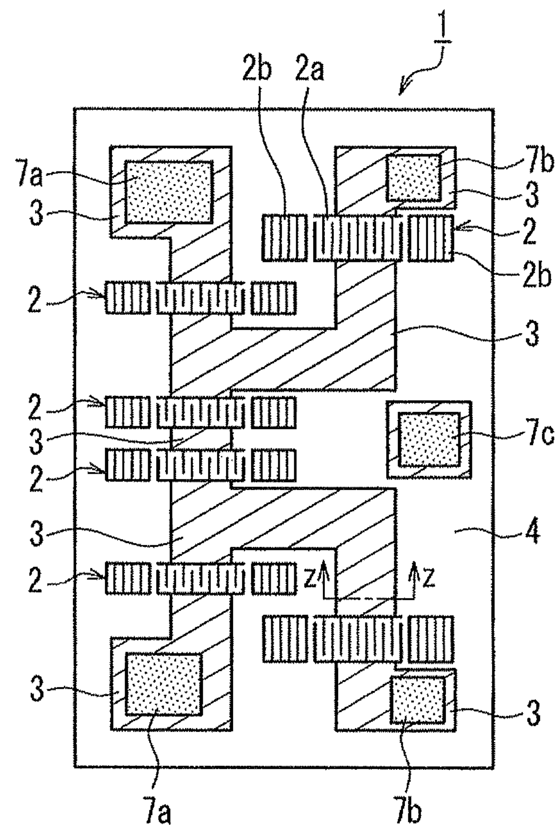
FIG. 6A is a plan view illustrating a configuration of an acoustic wave element of an embodiment.
Figure 6B:
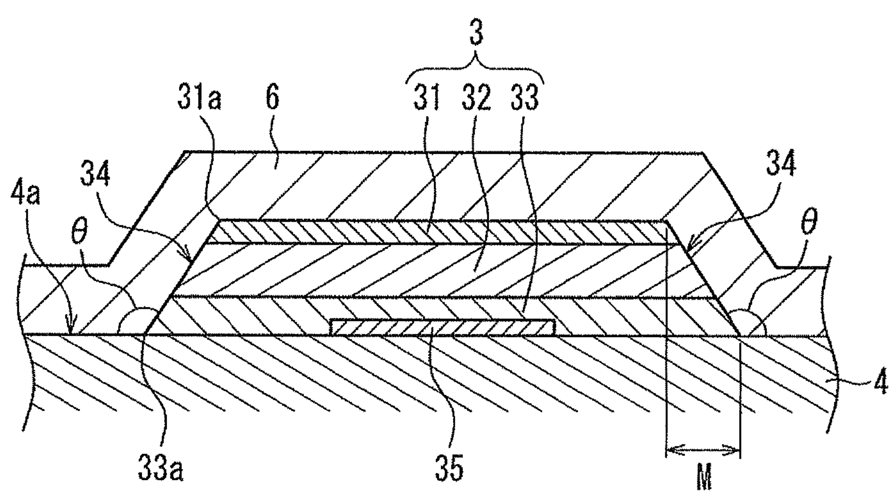
FIG. 6B is a cross-sectional view taken along a line Z-Z in FIG. 6A.

FIG. 6A illustrates a configuration of an acoustic wave element according to Embodiment 1. FIG. 6B illustrates a cross section taken along a line Z-Z in FIG. 6A.

An acoustic wave element 1 includes resonators 2, a power supply wiring portion 3, a piezoelectric substrate 4, a second medium 5, a third medium 6, and a terminal electrode 7. In FIG. 6A, the third medium 6 is not illustrated for the sake of clarity. Further, in FIG. 6A, regions of the power supply wiring portion 3 and the terminal electrode 7 are hatched for the sake of clarity.

The resonators 2 are formed on the piezoelectric substrate 4. Each of the resonators 2 includes an interdigitated electrode 2*a* that oscillates at a predetermined frequency when energized, and reflectors 2*b* that are disposed adjacent to respective ends of the interdigitated electrode 2*a* so as to reflect the oscillation generated by the interdigitated electrode 2*a*. The interdigitated electrode 2*a* and the reflectors 2*b* have a thickness of 100 to 300 nm, for example.

The power supply wiring portion 3 is formed on the piezoelectric substrate 4 so as to connect the respective resonators 2 electrically. As illustrated in FIG. 6B, the power supply wiring portion 3 has a first layer 31, a second layer 32, and a third layer 33 that are formed so as to cover an electrode 35. The power supply wiring portion 3 is formed so that a dimension in a width direction of an upper surface of the first layer 31 is at least larger than a dimension in a width direction of the electrode 35. The second layer 32 preferably is made of copper (Cu) that has low electrical resistance. The first layer 31 and the third layer 33 are formed so as to sandwich the second layer 32 therebetween, and made of a corrosion-resistant metal material. The first layer 31 and the third layer 33 can be made of one or two or more of titanium (Ti), chromium (Cr), nickel (Ni), molybdenum (Mo), tantalum (Ta), tungsten (W), platinum (Pt), and gold (Au). In the present embodiment, the first layer 31 and the third layer 33 are made of Ti that is highly resistant to corrosion and has good adhesion to the second layer 32 and the piezoelectric substrate 4. Further, the use of Ni for the first layer 31 and the third layer 33 can contribute to reduced cost. As illustrated in FIG. 6B, a side surface 34 of the power supply wiring portion 3 is tapered forward with a first angle θ formed with respect to a surface 4*a* of the piezoelectric substrate 4 being obtuse. Note that the side surface 34 refers to a surface ranging from an edge portion 31*a* of the first layer 31 to an edge portion 33*a* (portion that is in contact with the piezoelectric substrate 4) of the third layer 33. In the present embodiment, the first layer 31 has a film thickness of 150 nm, the second layer 32 has a film thickness of 500 nm, the third layer 33 has a film thickness of 20 nm, and the third medium 6 has a film thickness of 2 μm, for example. Thus, the thickness of the power supply wiring portion 3 is larger than that of the interdigitated electrode 2*a* and the reflectors 2*b*. Further, a margin dimension M is 2 to 3 μm in the present embodiment.

The piezoelectric substrate 4 (first medium) is a substrate on which the resonators 2, the power supply wiring portion 3, and the like are formed. The piezoelectric substrate 4 is made of lithium niobate ($LiNbO_3$), for example.

The second medium 5 is formed so as to cover the resonators 2. The second medium 5 is made of oxide silicon ($SiO_2$), for example. The second medium 5, which covers only the resonators 2, does not cover the power supply wiring portion 3 in consideration of heat dissipation. Although the $SiO_2$ film can be formed by a CVD (Chemical Vapor Deposition) method, another film formation method such as a sputtering method and a vacuum deposition method also may be used.

The third medium 6 is formed so as to cover the resonators 2 that are covered with the second medium 5, and the power supply wiring portion 3. In the present embodiment, the third medium 6 is made of alumina ($Al_2O_3$). However, for example, silicon nitride (SiN) or silicon carbide (SiC) also may be used.

The terminal electrode 7 is formed so as to be connected to the electrode 35 electrically and so as to be exposed without being covered with the third medium 6. The terminal electrode 7 includes input/output electrodes 7*a* capable of inputting and outputting an electric signal, ground electrodes 7*b*, and a dummy electrode 7*c*. The terminal electrode 7 is made of Au so as to form an Au bump.

2. Method for Manufacturing Acoustic Wave Element

FIGS. 7A, 8A, 9, 10, and 11 illustrate a transition during the manufacture of the acoustic wave element of the present embodiment. FIGS. 7B and 8B illustrate cross sections taken along lines Z-Z in FIGS. 7A and 8A, respectively. In FIGS. 8A, 9, 10, and 11, regions of the power supply wiring portion 3, the second medium 5, the third medium 6, and the terminal electrode 7 are hatched for the sake of clarity.

Figure 7A:
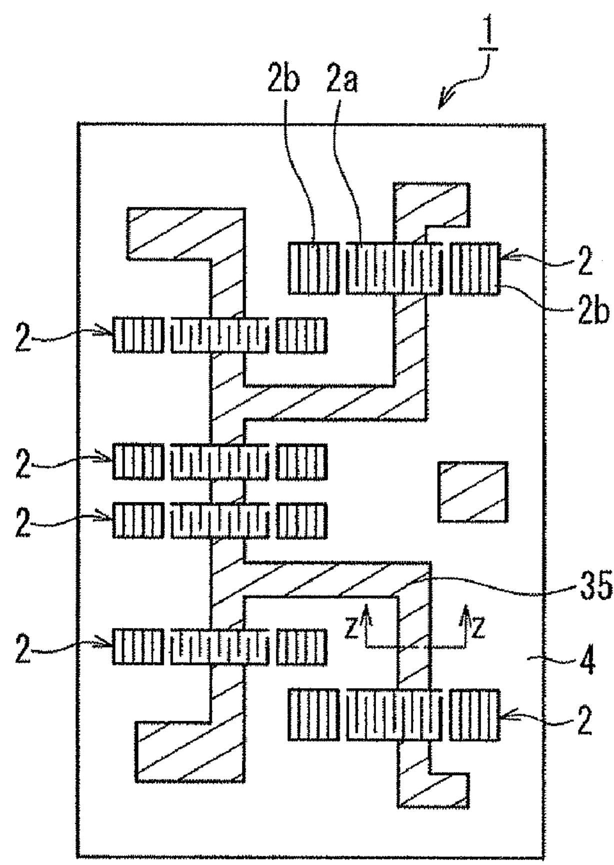
FIG. 7A is a plan view illustrating a state where electrodes are formed on a piezoelectric substrate.
Figure 7B:
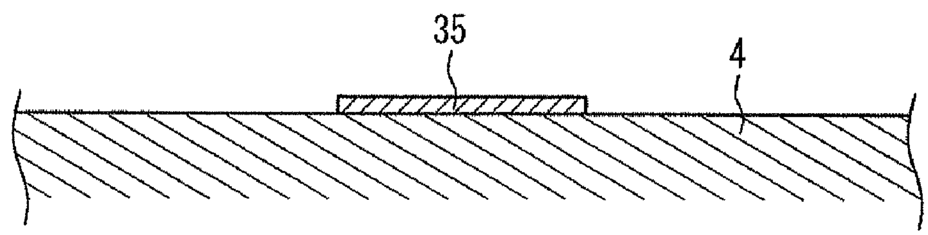
FIG. 7B is a cross-sectional view taken along a line Z-Z in FIG. 7A.

Initially, as illustrated in FIGS. 7A and 7B, an electrode that forms the resonators 2 and the electrode 35 that forms a base of the power supply wiring portion 3 are formed on the piezoelectric substrate 4. The resonators 2 and the electrode 35 are formed so as to be connected electrically to each other. Since the resonators 2 and the electrode 35 have the same film thickness, they can be formed at the same time.

Figure 8A:
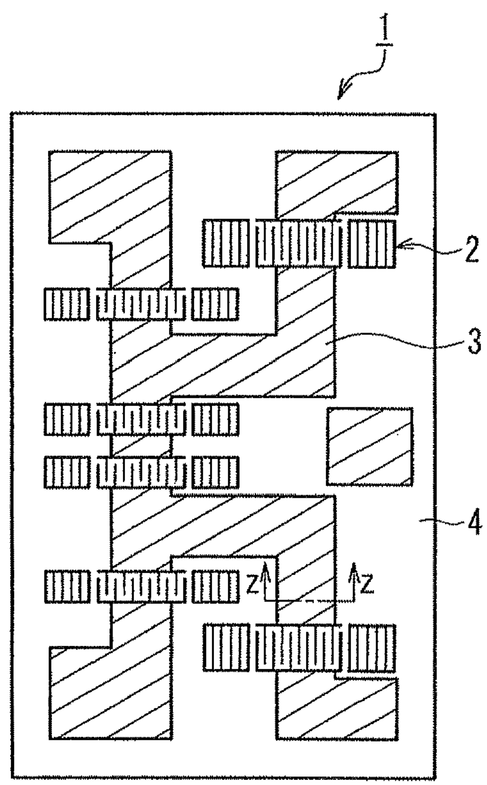
FIG. 8A is a plan view illustrating a state where a power supply wiring portion 3 is formed on the piezoelectric substrate.
Figure 8B:
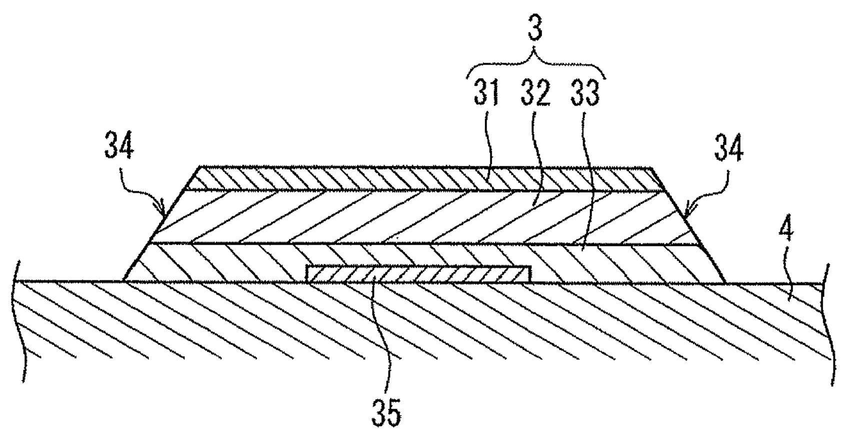
FIG. 8B is a cross-sectional view taken along a line Z-Z in FIG. 8A.

Next, as illustrated in FIGS. 8A and 8B, a Ti film is formed as the third layer 33 so as to cover the electrode 35. Then, a Cu film is formed as the second layer 32 on the third layer 33. Thereafter, a Ti film is formed as the first layer 31 on the second layer 32. In this manner, the power supply wiring portion 3 is obtained. At this time, the side surface 34 of the power supply wiring portion 3 is tapered forward. A specific description will be given of the method for forming the power supply wiring portion 3 later.

Figure 9:
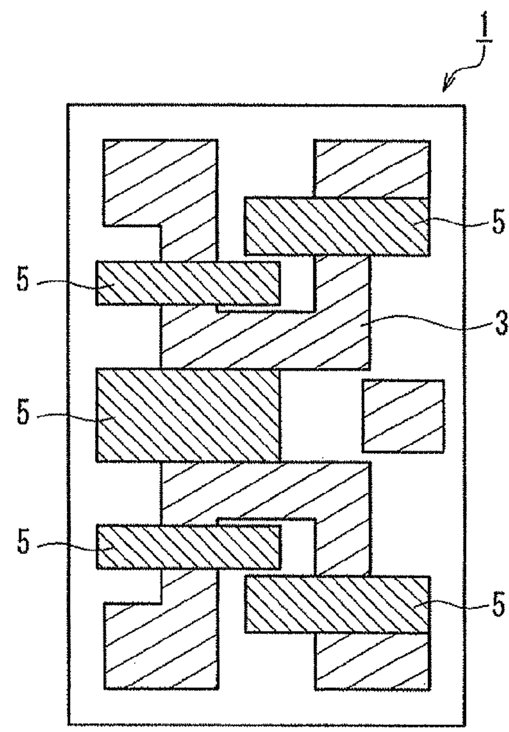
FIG. 9 is a plan view illustrating a state where a second medium is formed on resonators.

Then, as illustrated in FIG. 9, the second medium 5 is formed so as to cover the resonators 2. In the present embodiment, the second medium 5 is made of $SiO_2$. The formation of the second medium 5 is performed by a CVD method. After the formation of the second medium 5, excess $SiO_2$ remaining on the piezoelectric substrate 4 is removed by a dry etching method.

Figure 10:
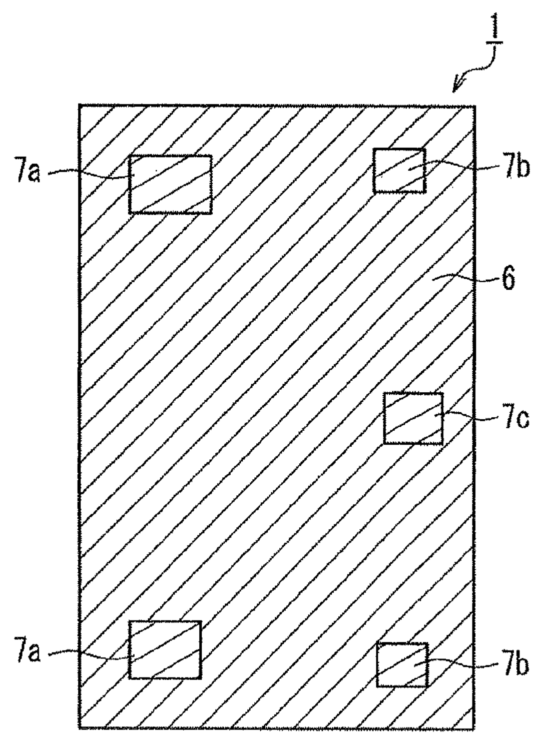
FIG. 10 is a plan view illustrating a state where a third medium is formed on the piezoelectric substrate.

Thereafter, as illustrated in FIG. 10, the third medium 6 is formed on the piezoelectric substrate 4. At this time, the third medium 6 is formed so as to cover portions other than regions of the power supply wiring portion 3 where the input/output electrodes 7*a*, the ground electrodes 7*b*, and the dummy electrode 7*c* are to be formed. In the present embodiment, the third medium 6 is patterned by a lift-off method.

Figure 11:
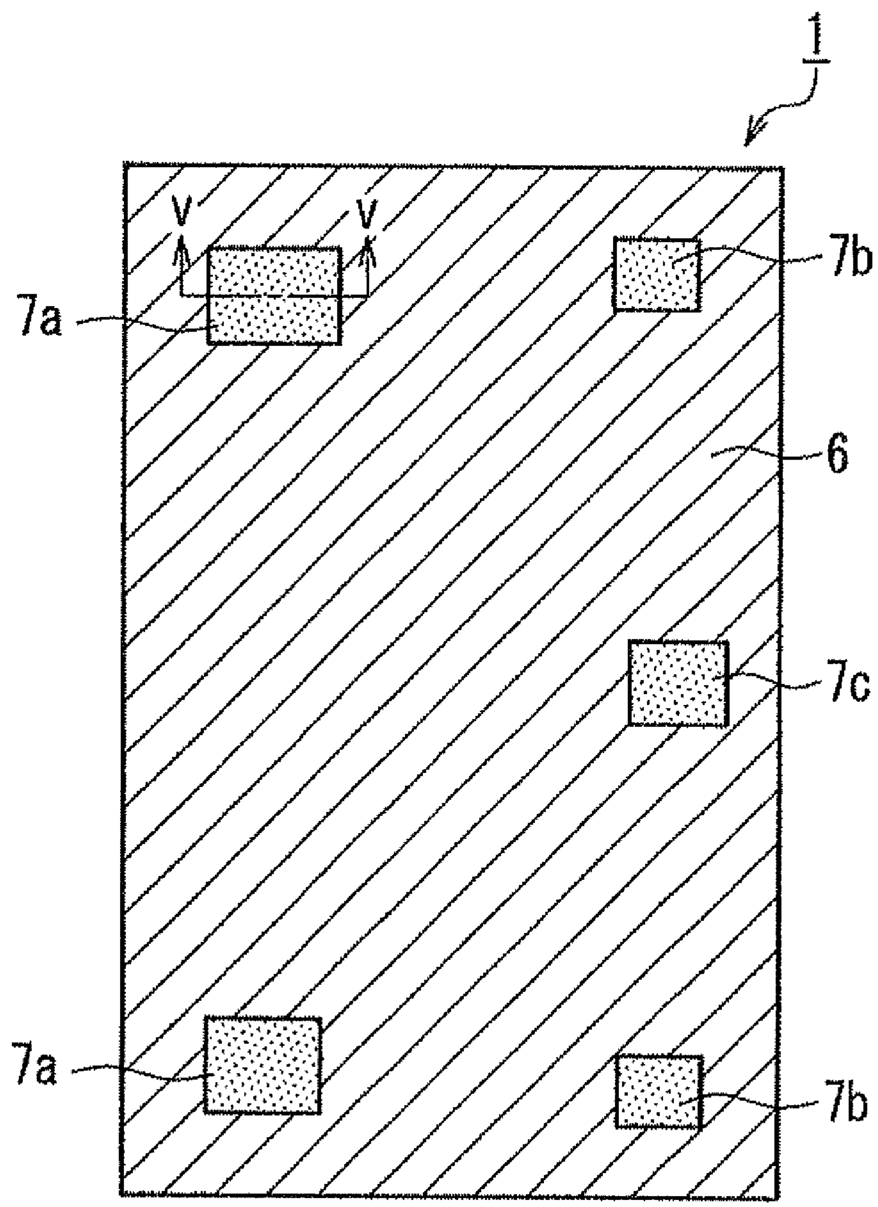
FIG. 11 is a plan view illustrating a state where a terminal electrode is formed in exposed regions of the power supply wiring portion 3 on the third medium 3.

After that, as illustrated in FIG. 11, the input/output electrodes 7*a* and the ground electrodes 7*b* are formed at the predetermined exposed positions on the third medium 6 on the power supply wiring portion 3. Further, the dummy electrode 7*c* is formed at the predetermined exposed position on the third medium 6 on the piezoelectric substrate 4. The input/output electrodes 7*a*, the ground electrodes 7*b*, and the dummy electrode 7*c* are made of Au so as to form an Au bump. Since the input/output electrodes 7*a*, the ground electrodes 7*b*, and the dummy electrode 7*c* are made of the same material to have the same film thickness, they can be formed at the same time.

[2-1. Method for Forming Power Supply Wiring Portion 3]

As illustrated in FIG. 6B, the power supply wiring portion 3 with the side surface 34 tapered forward can be formed by an existing lift-off process. FIGS. 12A to 12D illustrate a transition during the formation of the power supply wiring portion 3 using a lift-off process.

Figure 12A:
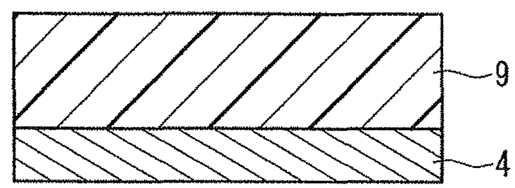
FIG. 12A is a cross-sectional view illustrating a state where a resist is formed on the piezoelectric film.

Initially, as illustrated in FIG. 12A, a resist 9 is applied onto the piezoelectric substrate 4. In the present embodiment, "SIPR-9684H-5.0", which is a resist for lift-off produced by Shinetsu Chemical Co., Ltd., is used.

Figure 12B:
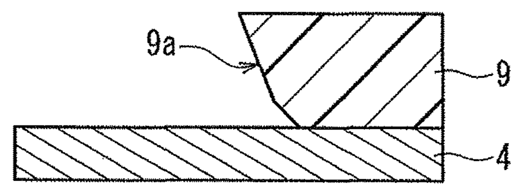
FIG. 12B is a cross-sectional view illustrating a state where the resist is patterned.

Next, as illustrated in FIG. 12B, the resist 9 applied onto the piezoelectric substrate 4 is subjected to an exposure and development process, so that a portion of the resist corresponding to the power supply wiring portion 3 is removed, and an inclined portion 9*a* that has a reverse tapered shape in cross section is formed.

Figure 12C:
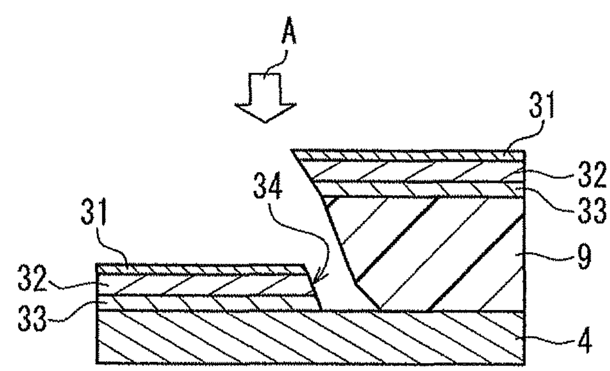
FIG. 12C is a cross-sectional view illustrating a state where the power supply wiring portion is formed (first method).

Then, as illustrated in FIG. 12C, the power supply wiring portion 3 made of the metal materials is formed. More specifically, a Ti film is formed at a predetermined position on the piezoelectric substrate 4 in a direction indicated by an arrow A, thereby forming the third layer 33. Then, a Cu film is formed on a surface of the third layer 33 in the direction indicated by the arrow A, thereby forming the second layer 32. Thereafter, a Ti film is formed on a surface of the second layer 32 in the direction indicated by the arrow A, thereby forming the first layer 31. At this time, since the resist 9 has the inclined portion 9*a* that is formed in a reverse tapered shape, the end portion 34 of the power supply wiring portion 3 is tapered forward.

Figure 12D:
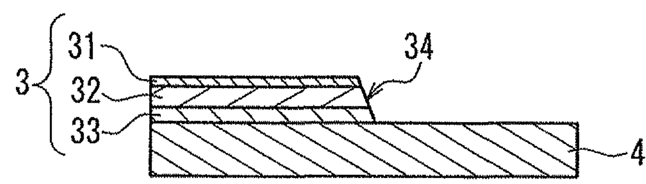
FIG. 12D is a cross-sectional view illustrating a state where the resist is removed (first method).

Thereafter, as illustrated in FIG. 12D, the resist 9 is removed so that unnecessary metal films are removed, thereby obtaining the power supply wiring portion 3.

Figure 12E:
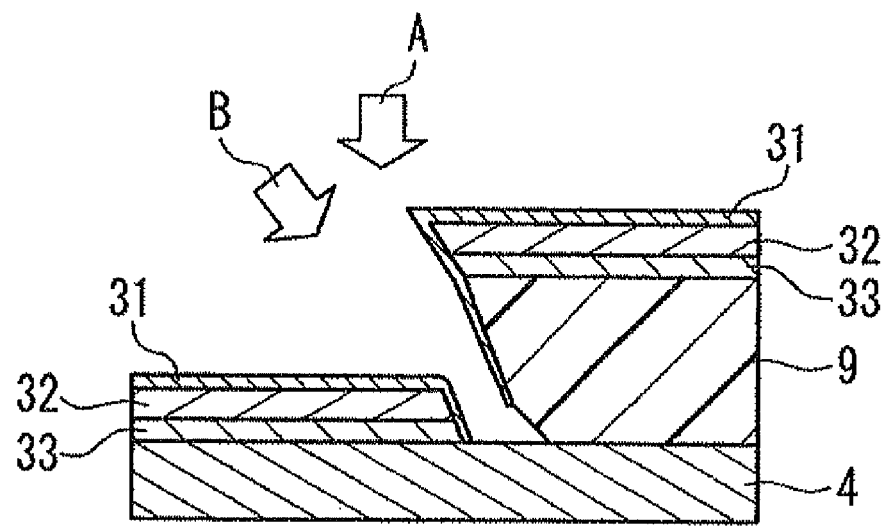
FIG. 12E is a cross-sectional view illustrating a state where the power supply wiring portion is formed (second method).
Figure 12F:
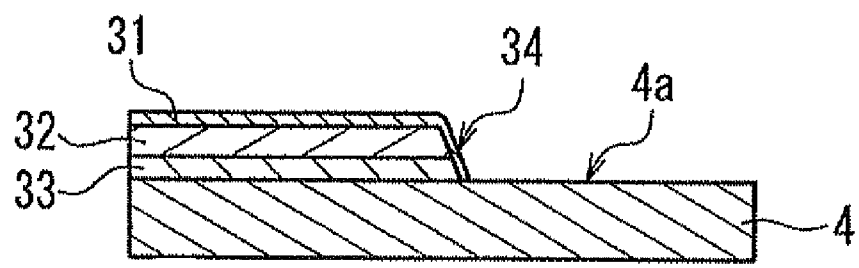
FIG. 12F is a cross-sectional view illustrating a state where the resist is removed (second method).

In the above-described film formation method, the power supply wiring portion 3 is formed in the direction perpendicular to the piezoelectric substrate 4 as indicated by the arrow A. However, as illustrated in FIG. 12E, only the first layer 31 may be formed in an oblique direction (direction indicated by an arrow B). As illustrated in FIG. 12E, when the first layer 31 is formed of Ti in the direction indicated by the arrow B after the formation of the second layer 32 and the third layer 33, the Ti film forming the first layer 31 can be formed so as to reach the surface 4*a* of the piezoelectric substrate 4 as illustrated in FIG. 12F, which allows an entire surface of the power supply wiring portion 3 to be covered with the first layer 31. Thus, the second layer 32 made of Cu that is relatively susceptible to corrosion can be shielded by the Ti film of the first layer 31, resulting in the power supply wiring portion 3 that is highly resistant to corrosion.

Figure 13:
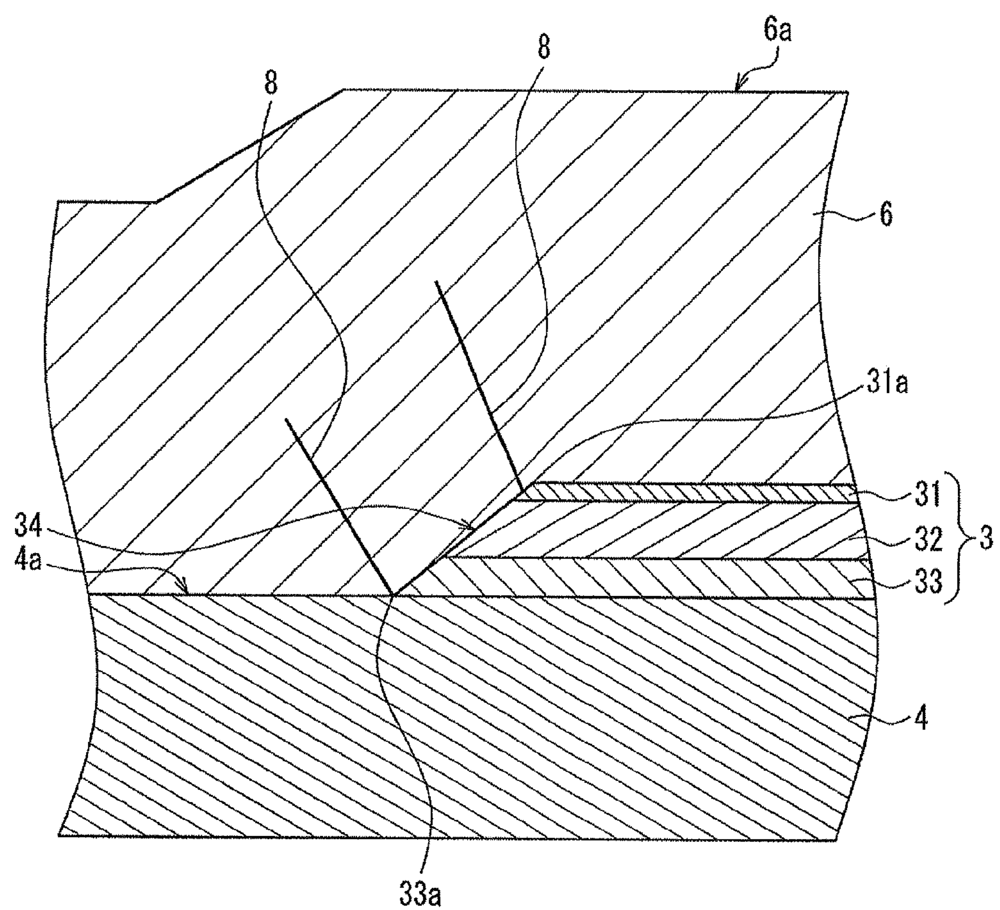
FIG. 13 is a cross-sectional view of the vicinity of the power supply wiring portion of the acoustic wave element in the present embodiment.

FIG. 13 is a cross-sectional view illustrating a relevant part in the vicinity of the power supply wiring portion 3 on which the third medium 6 is formed. As illustrated in FIG. 13, since the side surface 34 of the power supply wiring portion 3 is tapered forward, the formation of gaps 8 can be suppressed. The suppressed formation of the gaps 8 allows the gaps 8 to be prevented from reaching a surface 6*a* of the third medium 6.

Thus, it is possible to prevent water from entering the power supply wiring portion 3 externally, and accordingly corrosion of the power supply wiring portion 3 can be prevented.

Even if water enters the power supply wiring portion 3 through the gaps 8, corrosion of the second layer 32 of the power supply wiring portion 3 can be prevented because the first layer 31 and the third layer 33 are made of the corrosion-resistant metal.

Figure 14:
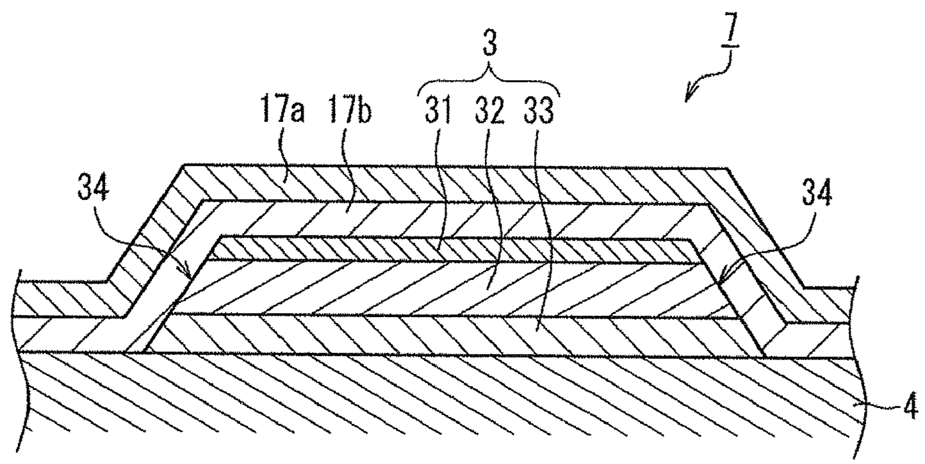
FIG. 14 is a cross-sectional view of the vicinity of the terminal electrode of the acoustic wave element in the present embodiment.

Although the present embodiment is directed to the configuration for preventing corrosion of the power supply wiring portion 3, the same effect can be achieved with respect to the terminal electrode 7 (see FIG. 9). FIG. 14 illustrates a cross section of the terminal electrode 7 (taken along a line V-V in FIG. 11). As illustrated in FIG. 14, the terminal electrode 7 has a laminated structure of a first layer 17*a* made of Au, for example, and a second layer 17*b* made of Ti, for example. The second layer 17*b* is formed so as to cover the power supply wiring portion 3. The first layer 17*a* is formed so as to cover the second layer 17*b*. The power supply wiring portion 3 also has the forward tapered side surface 34 at a position corresponding to the terminal electrode 7 as well as at other positions.

As described above, since the side surface 34 of the power supply wiring portion 3 at the position corresponding to the terminal electrode 7 is tapered forward, it is possible to suppress the formation of the gaps during the formation of the first layer 17*a* and the second layer 17*b*. Thus, it is possible to prevent water from entering the power supply wiring portion 3, and accordingly corrosion of the power supply wiring portion 3 can be prevented. Further, since the second layer 17*b* is made of Ti, the adhesion between the first layer 17*a* and the first layer 31 of the power supply wiring portion 3 can be improved.

3. Configuration of Duplexer

A duplexer is mounted on a mobile communication (high-frequency wireless communication) device such as a mobile phone terminal, a PHS (Personal Handy-phone System) terminal, and a wireless LAN system. The duplexer has functions of transmitting and receiving communication radio waves and the like, and is used in a wireless apparatus in which a transmission signal and a reception signal have different frequencies.

Figure 15:
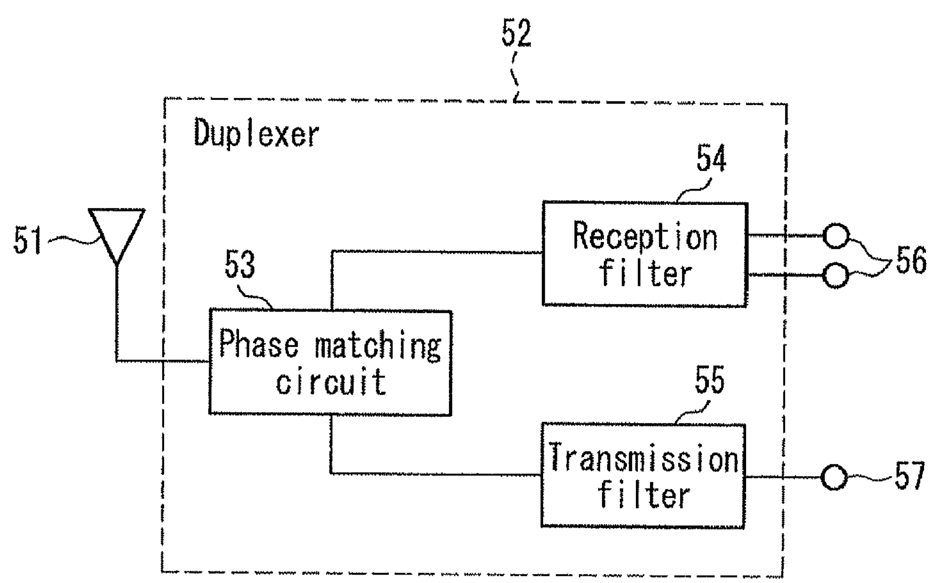
FIG. 15 is a block diagram illustrating a configuration of a duplexer.

FIG. 15 illustrates a configuration of a duplexer including the acoustic wave element of the present embodiment. A duplexer 52 includes a phase matching circuit 53, a reception filter 54, and a transmission filter 55. The phase matching circuit 53 is an element for adjusting the phase of the impedance of the reception filter 54 so as to prevent a transmission signal output from the transmission filter 55 from flowing to the reception filter 54 side. The phase matching circuit 53 is connected with an antenna 51. The reception filter 54 is formed of a band-pass filter that allows only signals in a predetermined frequency band to pass therethrough among reception signals input via the antenna 51. The reception filter 54 is connected with an output terminal 56. The transmission filter 55 is formed of a band-pass filter that allows only signals in a predetermined frequency band to pass therethrough among transmission signals input via an input terminal 57. The transmission filter 55 is connected with the input terminal 57. Here, the reception filter 54 and the transmission filter 55 include the acoustic wave element 1 of the present embodiment.

Since the acoustic wave element 1 of the present embodiment is included in the reception filter 54 and the transmission filter 55, corrosion of the power supply wiring portion 3 in the acoustic wave element 1 can be prevented. Further, an increased cross-sectional area of the power supply wiring portion 3 can lead to reduced electrical resistance. Thus, it is possible to achieve a high-reliability duplexer.

4. Configuration of Communication Module

Figure 16:
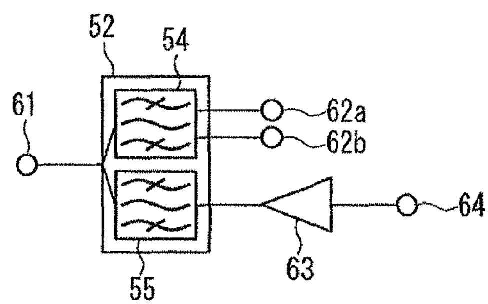
FIG. 16 is a block diagram illustrating a configuration of a communication module.

FIG. 16 illustrates an example of a communication module including the acoustic wave element of the present embodiment. As illustrated in FIG. 16, the duplexer 52 includes the reception filter 54 and the transmission filter 55. The reception filter 54 is connected with reception terminals 62*a* and 62*b* that are compatible with, for example, balanced output. The transmission filter 55 is connected with a power amplifier 63. Here, the reception filter 54 and the transmission filter 55 include the acoustic wave element of the present embodiment.

In a receiving operation, the reception filter 54 allows only signals in a predetermined frequency band to pass therethrough among reception signals input via an antenna terminal 61, and outputs the resultant reception signals to the outside from the reception terminals 62*a* and 62*b*. In a transmitting operation, the transmission filter 55 allows only signals in a predetermined frequency band to pass therethrough among transmission signals that have been input from a transmission terminal 64 and amplified by the power amplifier 63, and outputs the resultant transmission signals to the outside from the antenna terminal 61.

Since the acoustic wave element 1 of the present embodiment is included in the reception filter 54 and the transmission filter 55 of the communication module, corrosion of the power supply wiring portion 3 in the acoustic wave element 1 can be prevented. Further, an increased cross-sectional area of the power supply wiring portion 3 can lead to reduced electrical resistance. Thus, it is possible to achieve a high-reliability communication module.

Note that the configuration of the communication module illustrated in FIG. 16 is an example. The same effect also can be achieved by incorporating the acoustic wave element or the duplexer according to the present embodiment in other forms of communication modules.

5. Configuration of Communication Apparatus

Figure 17:
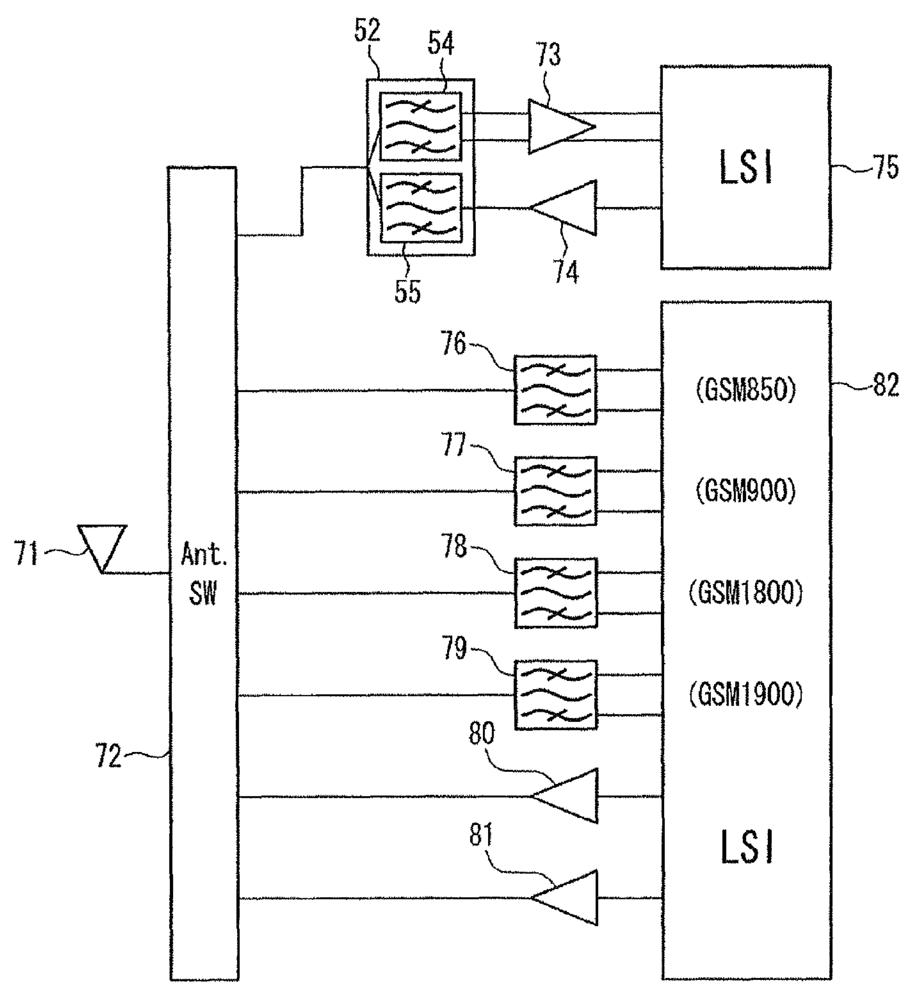
FIG. 17 is a block diagram illustrating a configuration of a communication apparatus.

FIG. 17 illustrates an RF block of a mobile phone terminal as an example of a communication apparatus including the acoustic wave element of the present embodiment. FIG. 17 illustrates a configuration of a mobile phone terminal that is compatible with a GSM (Global System for Mobile Communications) communication system and a W-CDMA (Wideband Code Division Multiple Access) communication system. The GSM communication system in the present embodiment is compatible with a 850 MHz band, a 950 MHz band, a 1.8 GHz band, and a 1.9 GHz band. Although the mobile phone terminal includes a microphone, a speaker, a liquid crystal display, and the like in addition to the configuration illustrated in FIG. 17, they are not illustrated in the figure since they are not necessary to the description of the present embodiment. Here, the reception filters 54, 76, 77, 78, and 79 and the transmission filter 55 include the acoustic wave element 1 of the present embodiment.

First, upon receipt of a reception signal input via an antenna 71, an antenna switch circuit 72 selects an LSI to be operated, based on whether the communication system of the reception signal is W-CDMA or GSM. If the input reception signal is compatible with the W-CDMA communication system, the antenna switch circuit 72 performs switching so that the reception signal is output to the duplexer 52. The reception signal input to the duplexer 52 is limited to a predetermined frequency band by the reception filter 54, and the resultant balanced reception signal is output to an LNA 73. The LNA 73 amplifies the input reception signal, and outputs the amplified reception signal to an LSI 75. The LSI 75 performs a demodulation process for obtaining an audio signal based on the input reception signal, and controls operations of respective units in the mobile phone terminal.

On the other hand, in the case of transmitting a signal, the LSI 75 generates a transmission signal. A power amplifier 74 amplifies the generated transmission signal, and outputs the amplified transmission signal to the transmission filter 55. The transmission filter 55 allows only signals in a predetermined frequency band to pass therethrough among the input transmission signals. The resultant transmission signals output from the transmission filter 55 are output to the outside from the antenna 71 via the antenna switch circuit 72.

If the input reception signal is compatible with the GSM communication system, the antenna switch circuit 72 selects one of the reception filters 76 to 79 in accordance with the frequency band of the reception signal, and outputs the reception signal to the selected reception filter. The reception signal is band-limited by the selected one of the reception filters 76 to 79, and the band-limited reception signal is input to an LSI 82. The LSI 82 performs a demodulation process for obtaining an audio signal based on the input reception signal, and controls operations of the respective units in the mobile phone terminal. On the other hand, in the case of transmitting a signal, the LSI 82 generates a transmission signal. A power amplifier 80 or 81 amplifies the generated transmission signal, and outputs the amplified transmission signal to the outside from the antenna 71 via the antenna switch circuit 72.

Since the acoustic wave element 1 of the present embodiment is included in the communication apparatus, corrosion of the power supply wiring portion 3 in the acoustic wave element 1 can be prevented. Further, an increased cross-sectional area of the power supply wiring portion 3 can lead to reduced electrical resistance. Thus, it is possible to achieve a high-reliability communication apparatus.

6. Effect of Embodiment etc

According to the present embodiment, since the side surface 34 of the power supply wiring portion 3 is tapered forward, corrosion of the power supply wiring portion 3 can be prevented. More specifically, when the side surface 34 of the power supply wiring portion 3 is tapered forward, the formation of the gaps 8 can be suppressed. Thus, it is possible to prevent water from entering the power supply wiring portion 3, and accordingly corrosion of the power supply wiring portion 3 can be prevented.

Further, according to the present embodiment, the first layer 31 and the third layer 33 of the power supply wiring portion 3 are made of the corrosion-resistant material. Thus, even if water enters the power supply wiring portion 3 through the gaps 8, corrosion of the second layer 32 can be prevented.

Further, since the power supply wiring portion 3 includes a laminated structure of the first layer 31, the second layer 32, and the third layer 33, in addition to the electrode 35 formed at the same time with the resonators 2, the cross-sectional area of a current carrying portion can be made larger, which can lead to reduced electrical resistance in the power supply wiring portion 3. Thus, it is possible to achieve a high-reliability acoustic wave element.

Further, in the present embodiment, the first angle θ (see FIG. 6B) formed between the side surface 34 of the power supply wiring portion 3 and the surface 4*a* of the piezoelectric substrate 4 is larger than a second angle (in the present embodiment, substantially 90 degrees) formed between a side surface of the electrode 35 in the resonators 2 and the surface 4*a* of the piezoelectric substrate 4. In this manner, when the side surface 34 of the power supply wiring portion 3 with a large film thickness is inclined at a small angle, the formation of the gaps 8 during the film formation can be suppressed. Further, since the electrode 35 in the resonators 2 has a small film thickness, a material for forming the electrode 35 can be reduced, which can contribute to reduced cost and the downsizing of the acoustic wave element 1.

Further, in the present embodiment, since the second layer 32 of the power supply wiring portion 3 is made of Cu, it is possible to reduce electrical resistance.

Further, in the present embodiment, since the power supply wiring portion 3 is not covered with the second medium 5 made of $SiO_2$ but covered with the third medium 6 made of alumina, for example, heat generated by the power supply wiring portion 3 can be dissipated. In particular, since the third medium 6 is made of alumina that has an excellent thermal conductivity, an excellent heat dissipation effect can be obtained. Further, as illustrated in FIG. 11, since the third medium 6 has a large surface area, heat can be dissipated efficiently. Thus, it is possible to achieve an acoustic wave element having excellent temperature characteristics.

Further, in the present embodiment, since the electrode forming the resonators 2 and the electrode 5 included in the power supply wiring portion can be formed at the same time, it is possible to reduce the number of manufacturing steps.

Further, in the present embodiment, since the power supply wiring portion 3 is patterned by a lift-off method, the side surface of the power supply wiring portion 3 can be tapered forward easily.

In the present embodiment, the side surface 34 of the power supply wiring portion 3 may be covered with the first layer 31 as illustrated in FIG. 12F. With this configuration, the second layer 32 that is relatively susceptible to corrosion can be shielded. Thus, even if water enters the power supply wiring portion 3 through the gaps 8, corrosion of the second layer 32 can be suppressed reliably.

Further, in the present embodiment, since the first layer 31 and the third layer 33 are made of Ti that is highly resistant to corrosion, corrosion of the power supply wiring portion 3 can be prevented. Further, since Ti has good adhesion to other metal materials, the use of Ti for the first layer 31 and the third layer 33 allows the respective layers forming the power supply wiring portion 3 to be adhered more securely to each other, and can lead to improved adhesion between the power supply wiring portion 3 and the piezoelectric substrate 4. Further, the use of Ni for the first layer 31 and the third layer 33 can contribute to reduced cost.

In the present embodiment, although the third medium 6 is formed by a CVD method, it can be obtained similarly by a sputtering method or a vacuum deposition method.

In the present embodiment, although the third medium 6 is made of alumina, it can be made of silicon nitride or silicon carbide similarly.

Examples of the communication apparatus to which the acoustic wave element, the duplexer, or the communication module including the same according to the present invention can be applied include a mobile phone terminal, a PHS terminal, and the like.

The present application is useful for an acoustic wave element that includes resonators and a power supply wiring portion that connects the respective resonators. The present invention is further useful for a duplexer, a communication module, and a communication apparatus that include the acoustic wave element.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. An acoustic wave element comprising:

resonators each including an electrode to excite acoustic waves;

a power supply wiring portion that is disposed so as to connect the resonators electrically;

a first medium on which the resonators and the power supply wiring portion are formed;

a second medium that is formed on the first medium so as to cover the resonators; and a third medium that is formed on the first medium so as to cover at least the second medium and the power supply wiring portion, the third medium being directly on the power supply wiring portion, wherein a side surface of the power supply wiring portion that is in contact with a surface of the first medium forms an obtuse first angle with respect to the surface of the first medium.

2. The acoustic wave element according to claim 1, wherein a second angle formed between a side surface of each of the resonators that is in contact with the surface of the first medium and the surface of the first medium is smaller than the first angle.

3. The acoustic wave element according to claim 1, wherein the power supply wiring portion includes a third layer formed on the surface of the first medium, a second layer formed on the third layer, and a first layer formed on the second layer, and the first layer and the third layer are made of a material that is more corrosion-resistant than a material of the second layer.

4. The acoustic wave element according to claim 3, wherein the second layer is made of a material containing copper as a main component.

5. The acoustic wave element according to claim 3, wherein the first layer or the third layer is formed so as to cover the second layer on the side surface of the power supply wiring portion.

6. The acoustic wave element according to claim 3, wherein the first layer or the third layer is made of one or two or more of metals of titanium, chromium, nickel, molybdenum, tantalum, tungsten, platinum, and gold.

7. The acoustic wave element according to claim 1, wherein the third medium covers a part or all of the power supply wiring portion.

8. The acoustic wave element according to claim 7, wherein the third medium is made of alumina.

9. The acoustic wave element according to claim 1, further comprising a terminal electrode that is formed so as to be connected electrically to the power supply wiring portion and so as not to be covered with the third medium, wherein the terminal electrode is made of titanium and gold.

10. The acoustic wave element according to claim 1, wherein the power supply wiring portion contains an electrode that is extended from the electrode included in the resonators.

11. A method for manufacturing an acoustic wave element, comprising:

forming resonators each including an electrode to excite acoustic waves on a first medium;

applying a resist onto the first medium;

patterning the resist so that a side surface of the patterned resist that is in contact with the first medium forms an acute angle with respect to a surface of the first medium;

forming a film of a material for forming a power supply wiring portion on the first medium;

removing the resist to form the power supply wiring portion, a side surface of the power supply wiring portion that is in contact with a surface of the first medium forming an obtuse first angle with respect to the surface of the first medium;

forming a second medium on the first medium so as to cover the resonators; and forming a third medium so as to cover at least the second medium and the power supply wiring portion, the third medium being directly on the power supply wiring portion.

12. The method for manufacturing an acoustic wave element according to claim 11, wherein in the fifth step, the third medium is formed by a sputtering method, a vacuum deposition method, or a chemical vapor deposition method.

13. The method for manufacturing an acoustic wave element according to claim 11, wherein the power supply wiring portion is patterned by a lift-off method.

14. A duplexer comprising the acoustic wave element according to claim 1.

15. A communication module comprising the duplexer according to claim 14.

16. A communication apparatus comprising the communication module according to claim 15.

* * * * *